US012598996B2

(12) United States Patent     (10) Patent No.:    US 12,598,996 B2

Yu et al.             (45) Date of Patent:      Apr. 7, 2026

(54) PASSIVE CIRCUIT ON A BACK-END-OF-LINE OF A PACKAGE

(71) Applicant: Intel Corporation, Santa Clara, CA (US)

(72) Inventors: Qiang Yu, Saratoga, CA (US); Georgios C. Dogiamis, Chandler, AZ (US); Gwang-Soo Kim, Portland, OR (US); Ibukunoluwa Momson, Allen, TX (US); Ali Farid, Sunnyvale, CA (US); Said Rami, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 17/853,572

(22) Filed: Jun. 29, 2022

(65) Prior Publication Data

US 2024/0006347 A1     Jan. 4, 2024

(51) Int. Cl.
| | |
|---|---|
| *H01L 23/58* | (2006.01) |
| *H01L 23/00* | (2006.01) |
| *H01L 23/522* | (2006.01) |

(52) U.S. Cl.
CPC ........ *H01L 23/585* (2013.01); *H01L 23/5226* (2013.01); *H01L 24/16* (2013.01); *H01L 2224/16145* (2013.01)

(58) Field of Classification Search
CPC ... H01L 23/585; H01L 23/5226; H01L 24/16; H01L 2224/16145
USPC ........................................................ 257/777
See application file for complete search history.

(56) References Cited

U.S. PATENT DOCUMENTS

| | | | | |
|---|---|---|---|---|
| 2007/0158787 A1* | 7/2007 | Chanchani | .............. | H01L 25/16 257/E21.705 |
| 2012/0075216 A1* | 3/2012 | Black | ..................... | H01L 23/66 345/173 |
| 2021/0118765 A1* | 4/2021 | Kang | .................. | H01L 23/5389 |
| 2022/0367402 A1* | 11/2022 | Song | .................. | H01L 21/6835 |

\* cited by examiner

*Primary Examiner* — Tu-Tu V Ho
(74) *Attorney, Agent, or Firm* — Schwabe, Williamson & Wyatt, P.C.

(57) ABSTRACT

Embodiments herein relate to systems, apparatuses, or processes directed to fabricating passive circuits on a surface of a BEOL of a package, for example on a C4 connection layer of the BEOL. In embodiments, the passive circuits may be fabricated using a standard bump process. Other embodiments may be described and/or claimed.

30 Claims, 16 Drawing Sheets

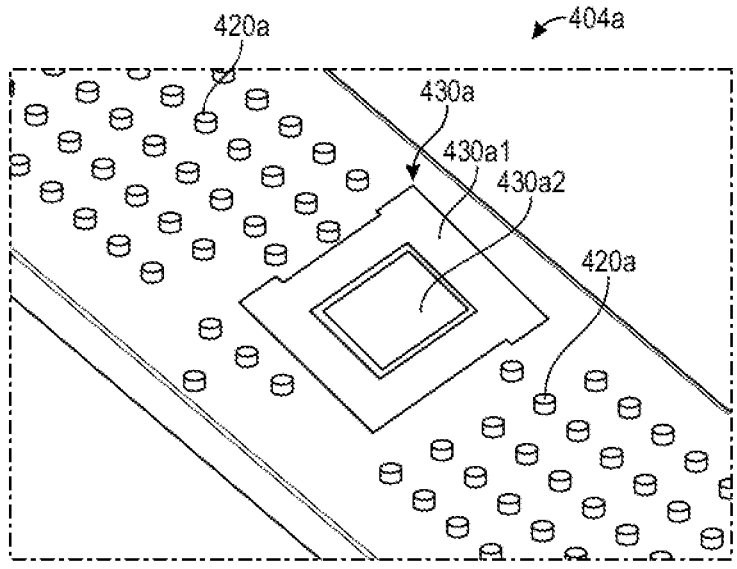
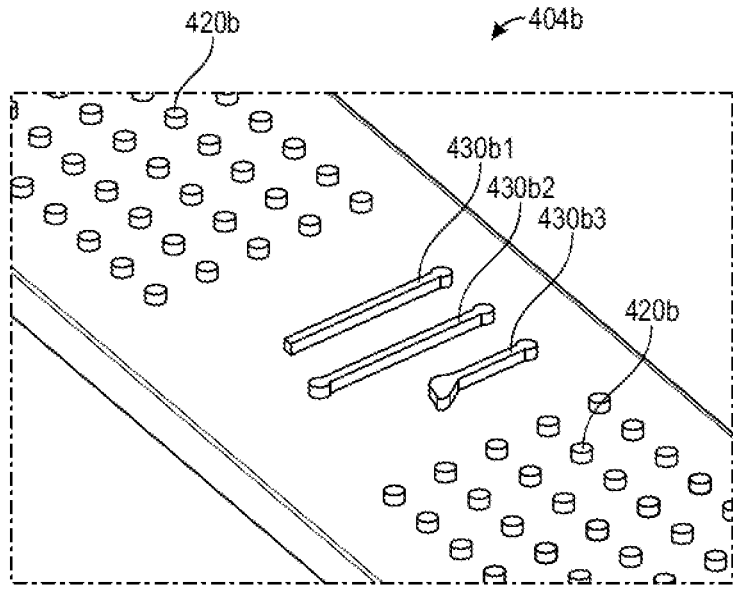
FIG. 4

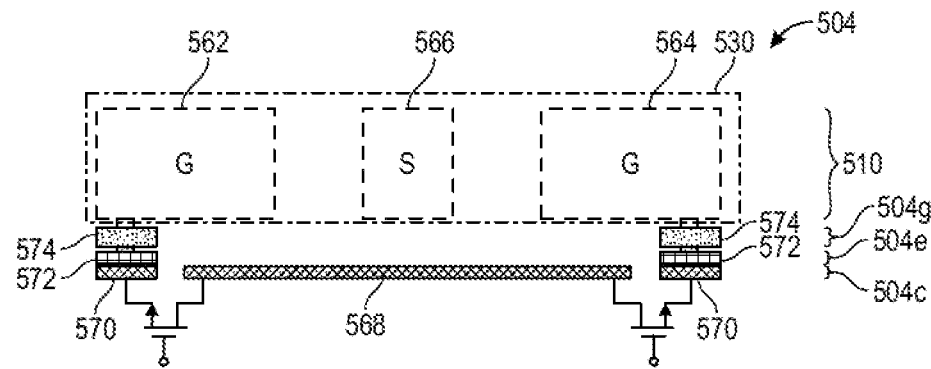
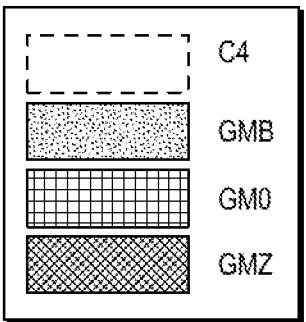
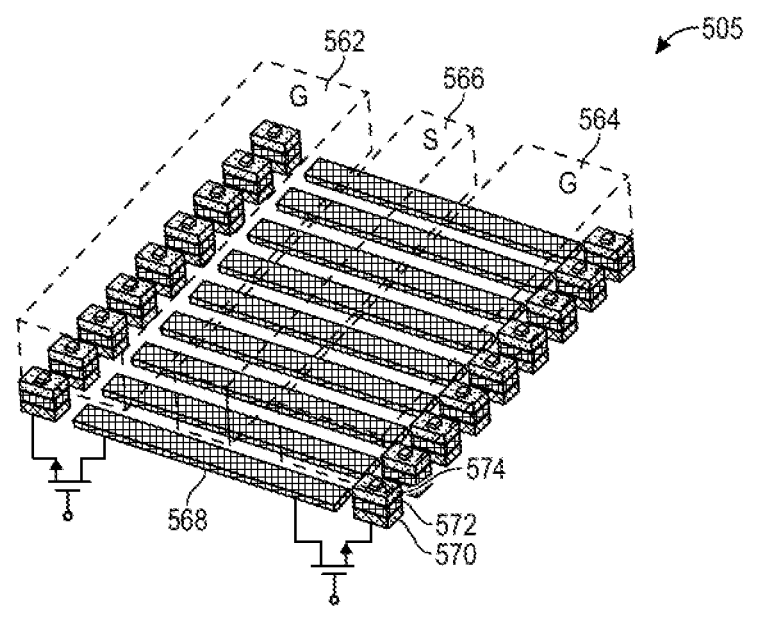
FIG. 5

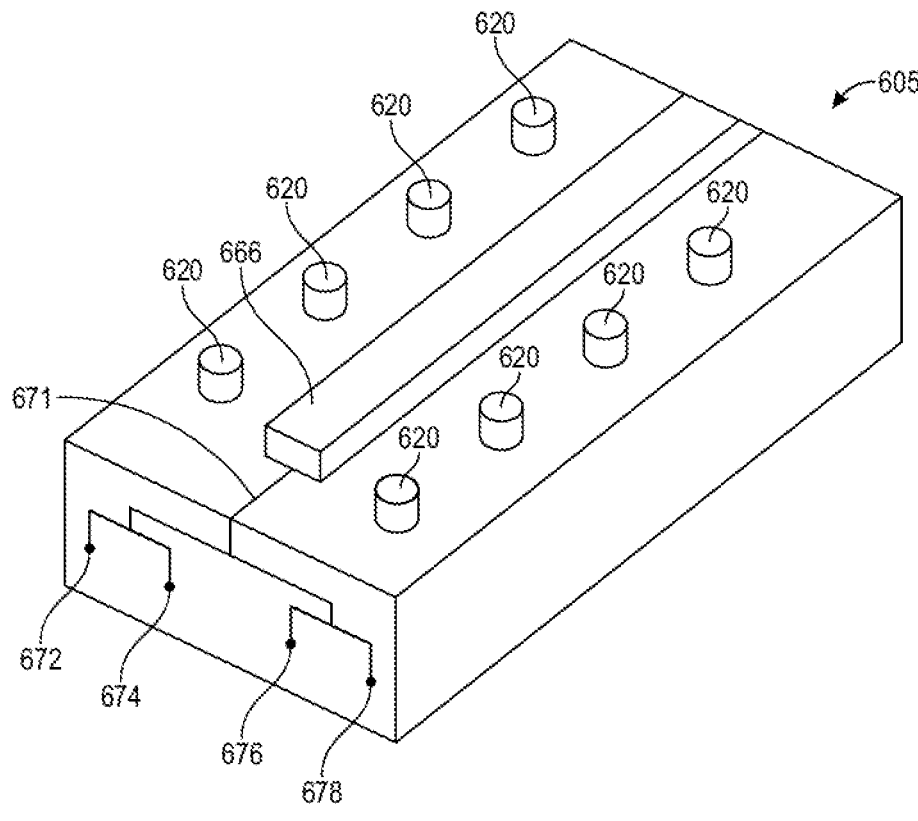
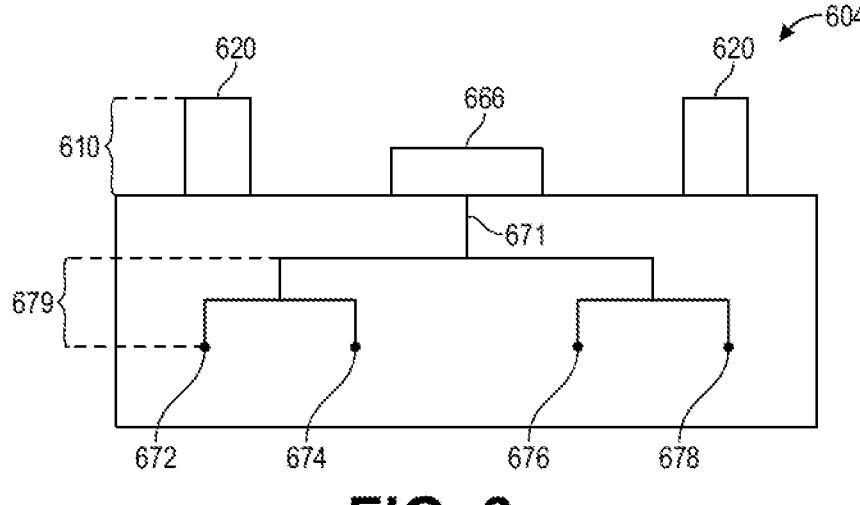
FIG. 6

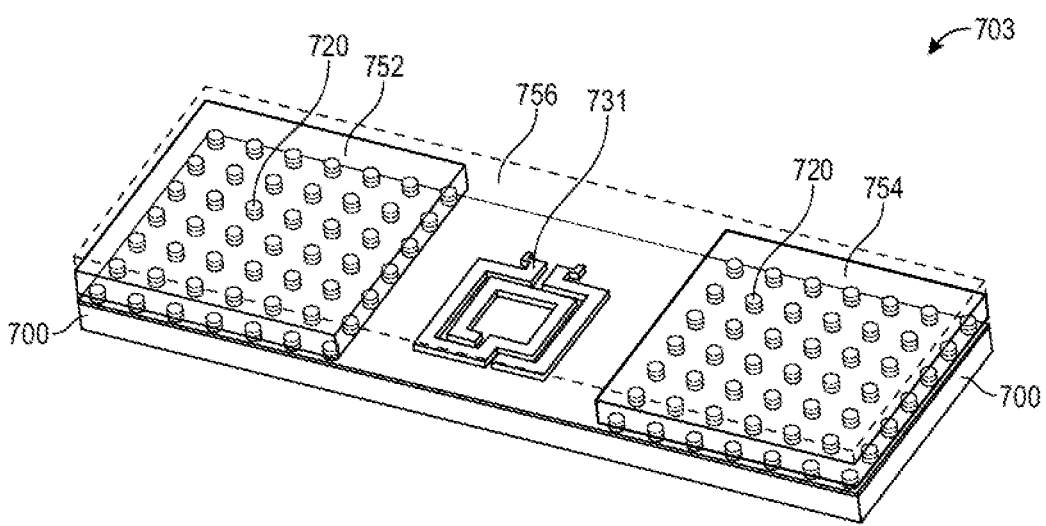
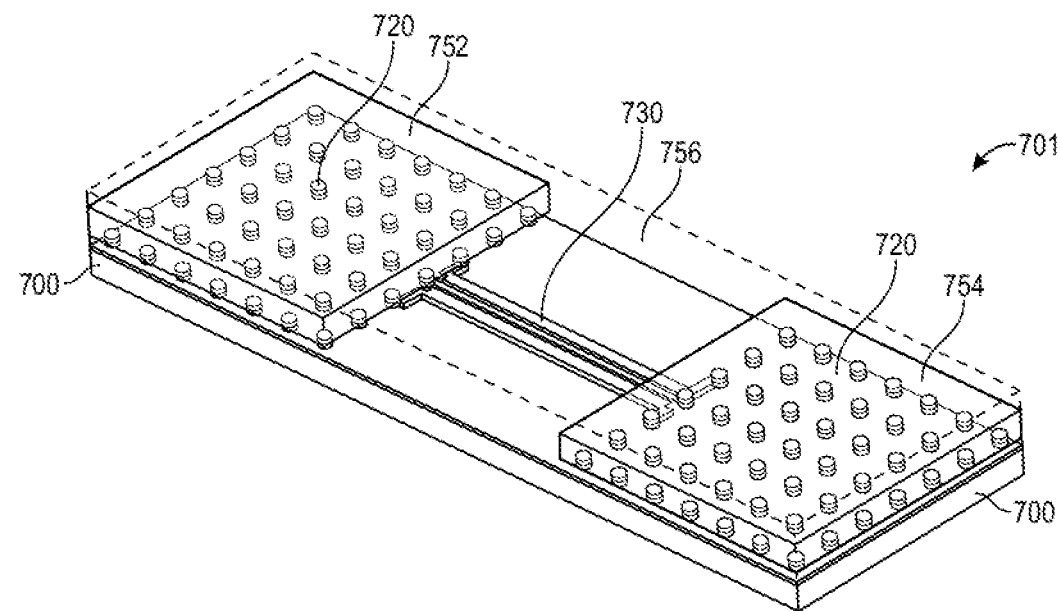
FIG. 7

| SIZE (um) | SPACE (um) | WIDTH (um) | TURN | L (nH) | $Q_{MAX}$ | SRF (GHz) |
|---|---|---|---|---|---|---|
| 966 | 968 | 970 | 972 | 974 | 976 | 978 |
| NUMBER OF TURNS SKEW | | | | | | |
| 300x300 | - | 20 | 1 | 0.6 | 34±2.0 | >40.0 |
| 300x300 | 15 | 20 | 2 | 1.4 | 31±0.6 | 21.5 |
| 300x300 | 15 | 20 | 3 | 2.0 | 25±0.4 | 15.0 |
| LOW FREQUENCY INDUCTOR | | | | | | |
| 500x500 | 20 | 55 | 2 | 1.6 | 51±1.8 | 10.0 |

| SIGNAL WIDTH (um) | SPACE (um) | GROUND WIDTH (um) | Z0 (Ohm) | INSERTION LOSS(dB/mm) |
|---|---|---|---|---|
| | | CPW | | |
| 16 | 15 | 30 | 50 | 0.8 |
| | | MICROSTRIP | | |
| 15 | - | - | 50 | 0.5 |

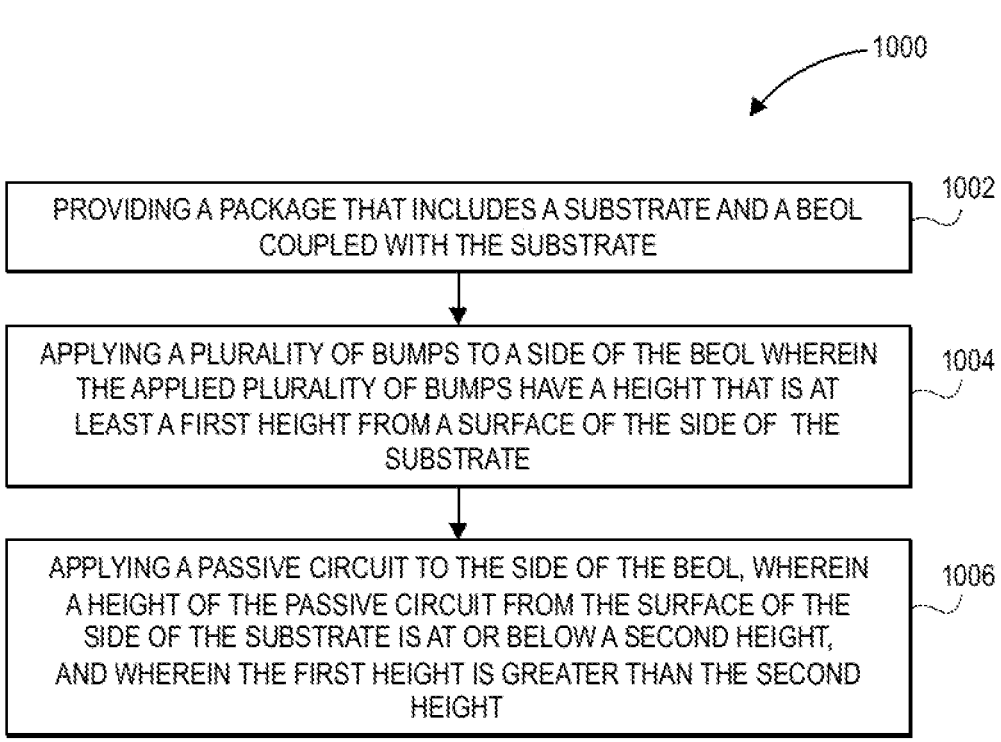

1000

PROVIDING A PACKAGE THAT INCLUDES A SUBSTRATE AND A BEOL COUPLED WITH THE SUBSTRATE
1002

APPLYING A PLURALITY OF BUMPS TO A SIDE OF THE BEOL WHEREIN THE APPLIED PLURALITY OF BUMPS HAVE A HEIGHT THAT IS AT LEAST A FIRST HEIGHT FROM A SURFACE OF THE SIDE OF THE SUBSTRATE
1004

APPLYING A PASSIVE CIRCUIT TO THE SIDE OF THE BEOL, WHEREIN A HEIGHT OF THE PASSIVE CIRCUIT FROM THE SURFACE OF THE SIDE OF THE SUBSTRATE IS AT OR BELOW A SECOND HEIGHT, AND WHEREIN THE FIRST HEIGHT IS GREATER THAN THE SECOND HEIGHT
1006

FIG.10

PASSIVE CIRCUIT ON A BACK-END-OF-LINE OF A PACKAGE

FIELD

Embodiments of the present disclosure generally relate to the field of package assemblies, and in particular packages that include a back-end-of-line (BEOL) on a substrate with bumps on a surface of the BEOL.

BACKGROUND

Continued reduction in end product size of mobile electronic devices such as smart phones and ultrabooks is a driving force for the development of reduced-size system in package components. Part of this reduction includes increasing the density of passive circuits in a package substrate while reducing the number of layers of the substrate and reducing insertion loss.

BRIEF DESCRIPTION OF THE DRAWINGS

FIG. 4 illustrates perspective views of a portion of a substrate that includes stubs and an antenna on a BEOL C4 connection layer, in accordance with various embodiments.

FIG. 5 illustrates a perspective view and a cross section side view of a coplanar waveguide on a BEOL C4 connection layer, in accordance with various embodiments.

FIG. 6 illustrates a perspective view and a cross section side view of a combiner circuit with a microstrip on a BEOL C4 connection layer, in accordance with various embodiments.

FIG. 7 illustrates perspective views of examples of packages that include passive circuits on a BEOL C4 connection layer, in accordance with various embodiments.

FIG. 10 illustrates an example of a process for creating a passive circuit on a BEOL of a package, in accordance with various embodiments.

DETAILED DESCRIPTION

Figure 1:
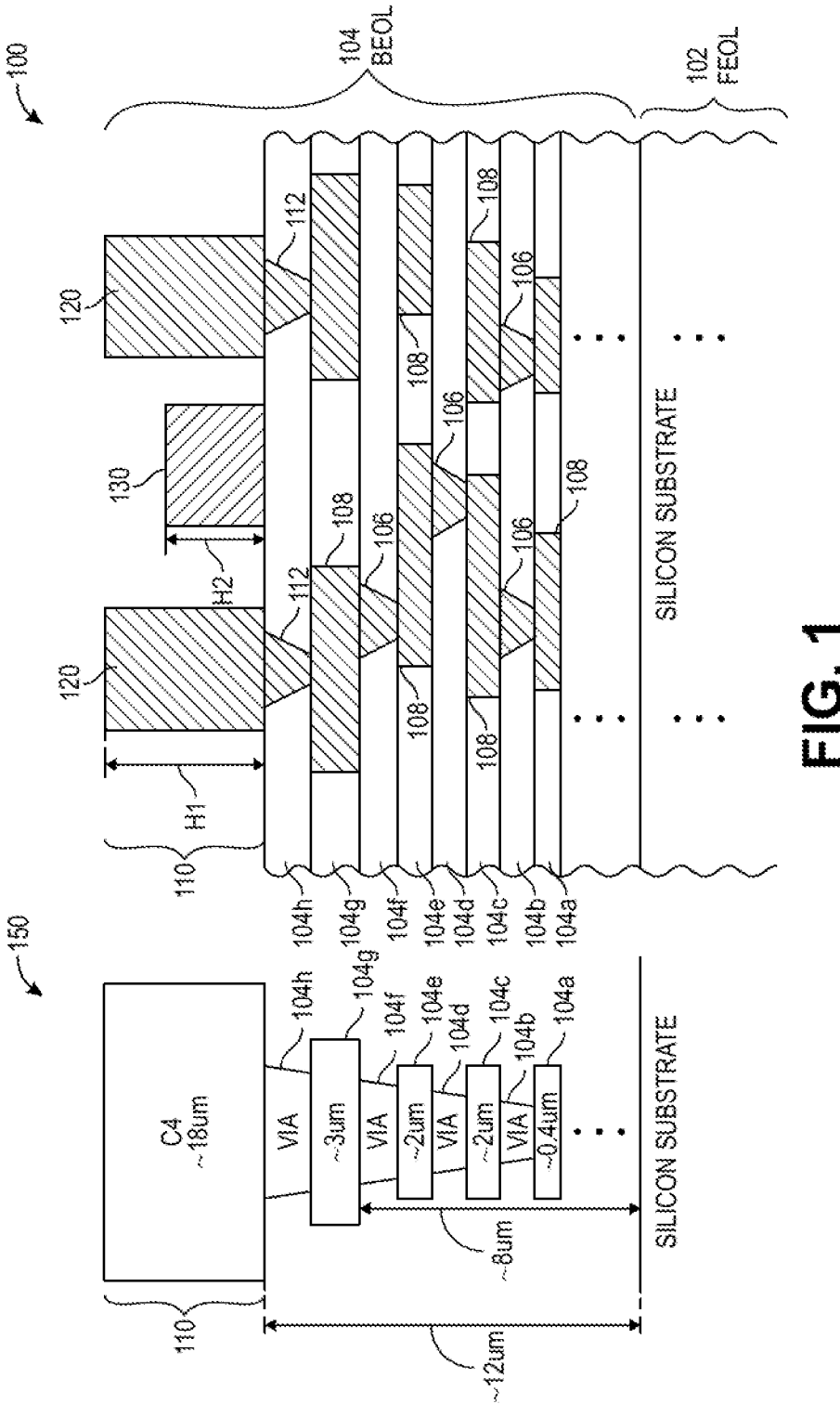
FIG. 1 illustrates a cross section side view of a package that includes a substrate and a BEOL on the substrate, with a controlled collapse chip connection (C4) layer on a surface of the BEOL, in accordance with various embodiments.

Embodiments of the present disclosure may generally relate to systems, apparatus, and/or processes directed to fabricating passive circuits on a surface of a back-end-of-line (BEOL) of a package, for example on a C4 connection layer of the BEOL, along with the C4 bumps. In embodiments, the C4 connection layer may be referred to as a bump layer. In embodiments, the passive circuits may be fabricated using a standard bump process and may act as on-chip, low-loss passive circuits. In embodiments, the passive circuits may be used for radiofrequency (RF), millimeter wave (mmWave), and sub terahertz applications. In embodiments, the passive circuits coexist in the C4 connection layer with bumps, which may include copper pillars.

In embodiments, the passive circuits may include, but are not limited to, inductors, transmission lines, open or short stubs, wave launchers, antennas, coplanar waveguides, or microstrips. In embodiments, a C4 connection layer, with a height around 18 μm, may be 4 to 5 times higher as compared to the top or the highest metal layer of a typical silicon process to create a BEOL or a substrate coupled with the BEOL. As a result, passive circuits may have a height that is substantially greater than a height of similar passive circuits that are constructed within the substrate or BEOL.

In addition, due to the close proximity of passive circuits on the C4 connection layer to the top layer of the package, these passive circuits may communicatively couple signals between the package and a die or substrate coupled with the package, for example in a flip chip configuration. In embodiments, a passive circuit as a wave launcher or antenna in the C4 connection layer may be electrically coupled with a top layer of the package and may transmit or receive signals to a die proximate to the package.

In legacy implementations, on-chip passive circuits in silicon technologies may suffer from high loss due to thin metal thicknesses and low substrate resistivity of these legacy passive circuits. Even with legacy silicon-on-insulator (SOI) processes, the substrate resistivity is considerably lower as compared to III-V technologies. As a result, these lossy legacy passive circuits may limit high-frequency circuit and system performance. For example, including systems and an operating frequency of waveguide-based communication systems, which may include automotive and data center implementations.

In embodiments, the C4 connection layer of the BEOL may be more than 50% further away from a silicon substrate that may be substantially lossy. In addition, due to height that results in a large cross-sectional area of the C4 connection layer, ultra-low loss and high current capacity on-chip inductors and transmission lines can be implemented. Embodiments may significantly boost device performance, as compared to existing on-chip solutions, by moving passive circuits such as transmission lines to the C4 connection layer. This enables coupling with signal to wave launchers in a package with lower loss. In other embodiments, the launcher may be implemented as a split design where one part of the launcher is on a package, and the other is on the C4 connection layer. The lower loss and higher current capacity can save on input/output (I/O) circuit power, increase channel reach, and reduce package and platform cost.

Embodiments for creating passive circuits may use a standard bump process, with little to no modification of the process. In embodiments, for critical passive components, adjacent bumps may be depopulated within the C4 connection layer. In additional embodiments, the passive circuits may be a substantial distance from the substrate, separated by the BEOL, to reduce lossiness if the passive circuits were closer to or embedded within the substrate. In embodiments, the passive circuits within the C4 connection layer may be referred to as passive circuits in a far backend of the package. In embodiments, the passive circuits may be created using customized bump patterns within the C4 connection layer.

In legacy implementations, to reduce the effective substrate loss on a passive circuit, a metal stack height of a passive circuit within the package may be increased, so that the top metals of the legacy passive circuit are further away from substrate. However, this legacy approach inevitably introduces more loss due to required vertical interconnects between transistors and passive circuits within the metal layers and coupling with a top metal layer. In addition, the heights of the top metal layers in this legacy implementation can only be increased within a limited range, with thicknesses remaining at around a few micrometers. In addition, legacy implementations that use a redistribution layer (RDL) for passive circuits suffer from thin metal thickness and being embedded within a lossy substrate. Additionally, implementing such legacy techniques increases process cost while potentially decreasing package yield.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a cross section side view of a package that includes a substrate and a BEOL on the substrate, with a controlled collapse chip connection (C4) layer on a surface of the BEOL, in accordance with various embodiments. Package 100 shows a cross section side view of a partial package that includes a front-end-of-line (FEOL) 102 that is part of a silicon substrate of the package, and a BEOL 104 on the FEOL 102.

The BEOL 104 includes a plurality of metal layers 104a, 104c, 104e, 104g, that may include electrical routings 108, and the plurality of dielectric layers 104b, 104d, 104f, 104h, that may include electrically conductive vias 106 and 112. In embodiments, the electrically conductive vias 106, 112 and the electrical routings 108 may include copper. In embodiments, the various electrically conductive vias 106, 112 may vertically electrically couple the various electrical routings 108.

In embodiments, the electrically conductive vias 112 may couple with C4 bumps 120 within the C4 connection layer 110. In embodiments, a passive circuit 130 (shown in part) may be within the C4 connection layer 110, and between the C4 bumps 120. In other embodiments, as discussed below, the passive circuit 130 may electrically couple with one or more of the C4 bumps 120.

In embodiments, the C4 bumps 120, which may be conductive interconnect structures such as solder bumps or copper pillars, etc., may be created using standard techniques for forming C4 bumps on a BEOL 104. In embodiments, the passive circuit 130 may also be formed using similar techniques used in forming C4 bumps 120. In embodiments, a height H1 of the C4 bumps 120 may be at or approximately at a depth of the C4 connection layer, which in embodiments may be approximately 18 μm. In embodiments, a height H2 of the passive circuit 130 may be less than the height of the C4 bumps 120. Thus, when another device (not shown) is coupled with the C4 bumps 120, the passive circuit 130 may not directly physically or directly electrically couple with the device (not shown).

Note that the height H2 of the passive circuit 130 may be substantially greater than a height that may be achieved within the metal layers 104c, 104e, 104g, which may be at 3 micrometers or less. As a result, the passive circuit 130 may have a thicker dimension, thus resulting in a greater conductivity and lower loss while the passive circuit 130 is in operation.

In addition, if a passive circuit 130 were placed in a layer of the BEOL 104 below the C4 connection layer 110, it would be substantially closer to the FEOL 102 of the silicon substrate. As a result, the passive circuit 130 will be subject to increased lossiness due to the lossy characteristics of the silicon substrate in the FEOL 102. For example, if a passive circuit (not shown) were placed within metal layer 104g, which may have a thickness of 3 μm, that passive circuit (not shown) would have a distance of 8 μm between the metal layer 104g and the FEOL 102. In comparison, the passive circuit 130 will have a distance of 12 μm between the C4 connection layer 110 and the FEOL 102, a 50% increase in distance, which reduces the loss from the silicon substrate of the FEOL 102.

Diagram 150 shows a cross-section side view of package 100.

Figure 2:
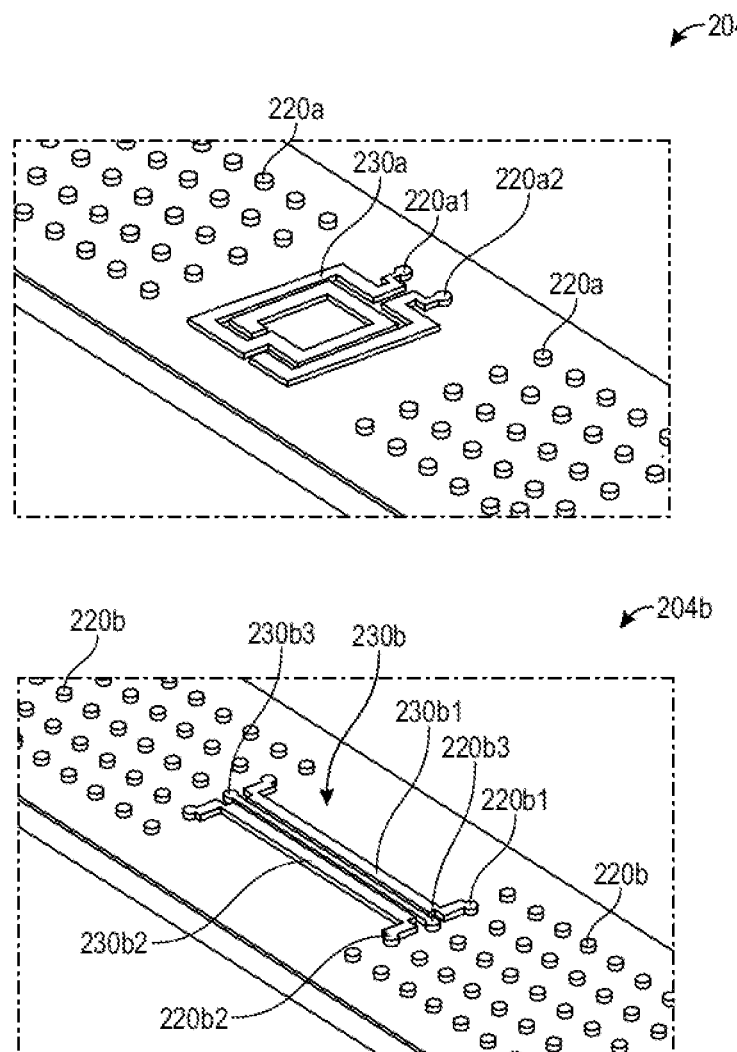
FIG. 2 illustrates perspective views of a portion of a substrate that includes an inductor and a transmission line on a BEOL C4 connection layer that includes bumps on a surface of the BEOL, in accordance with various embodiments.

FIG. 2 illustrates perspective views of a portion of a substrate that includes an inductor and a transmission line on a BEOL C4 connection layer that includes bumps on a surface of the BEOL, in accordance with various embodiments. BEOL 204a, which may be similar to BEOL 104 of FIG. 1, shows a perspective view of an inductor 230a, which may be similar to passive circuit 130 of FIG. 1. In embodiments, inductors such as inductor 230a may serve as building blocks for other passive circuits, such as transformers, baluns, and lumped-element based couplers. In embodiments, other bumps 220a, which may be similar to C4 bumps 120 of FIG. 1, may also be placed proximate to the inductor 230a. As shown in this embodiment, the inductor 230a may be electrically coupled with a first bump 220a1 and a second bump 220a2. In embodiments, the inductor 230a may be formed using existing techniques for forming bumps on a C4 connection layer.

BEOL 204b, which may be similar to BEOL 104 of FIG. 1, shows a perspective view of a transmission line 230b, which may be similar to passive circuit 130 of FIG. 1. In embodiments, other bumps 220b, which may be similar to C4 bumps 120 of FIG. 1, may also be placed proximate to the transmission line 230b. As shown in this embodiment, the transmission line 230b may include two ground lines 230b1, 230b2 that are on either side of the signal line 230b3. The signal line 230b3 may be electrically coupled with one of the bumps 220b3, and the ground lines 230b1, 230b2, may be electrically coupled with bumps 220b1, 220b2, respectively. In embodiments, the transmission line 230b and its components may be formed using existing techniques for forming bumps on a C4 connection layer. In embodiments, transmission line 230b may provide low loss, low ripple, and a high-speed link between various dies in a three-dimensional integrated circuit.

Figure 3:
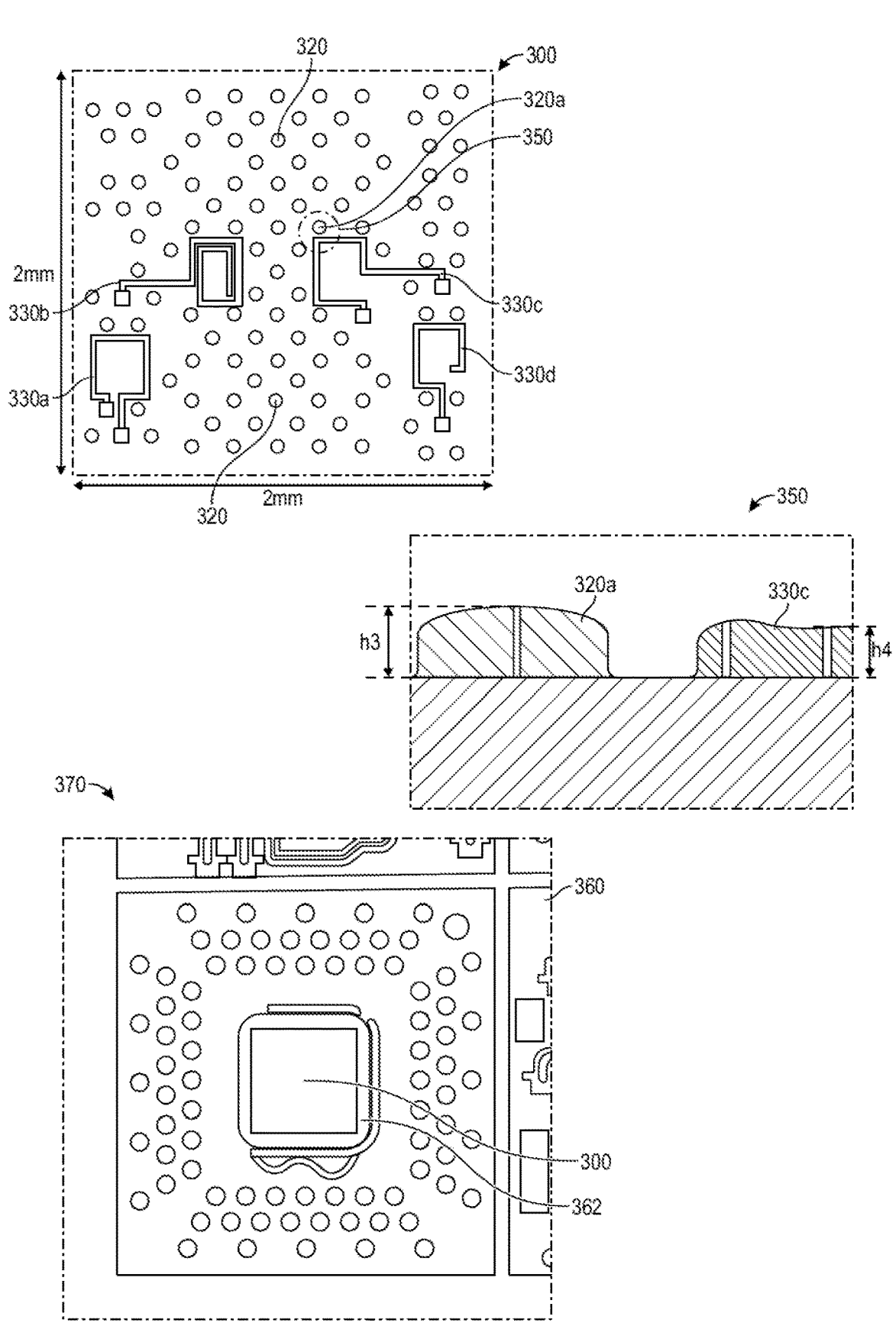
FIG. 3 illustrates a top-down and cross section side view of a portion of a surface of a 2 mm×2 mm chip that includes bumps and passive circuits on a BEOL C4 connection layer, and a top-down view of a package in which the chip is seated, in accordance with various embodiments.

FIG. 3 illustrates a top-down and cross section side view of a portion of a surface of a 2 mm×2 mm chip that includes bumps and passive circuits on a BEOL C4 connection layer, and a top-down view of a package in which the chip is seated, in accordance with various embodiments. Chip 300, which may be similar to package 100 of FIG. 1, shows a top-down view of a BEOL layer that includes bumps 320, which may be similar to C4 bumps 120 of FIG. 1, and four passive inductor circuits 330a, 330b, 330c, 330d, which may be similar to passive circuit 130 of FIG. 1. One or more of the four passive inductor circuits 330a, 330b, 330c, 330d, may be electrically coupled with one or more of the bumps 320.

Diagram 350 shows a cross section side view of region 350 shown on chip 300. Bump 320a has a height h3, which may be 17.3 μm. A portion of the passive inductor circuit 330c, has a height h4, which may range between 11.8 μm and 12.2 μm. In embodiments, the height h3 will be greater than the height h4.

Diagram 370 shows a top-down view of a flip chip implementation where the chip 300 is flipped over and is inserted into the package 360. In embodiments, an epoxy 362 may be used to secure the chip 300 to the package 360. In embodiments when the height h3 of the bump 320a is less than the height h4 of the passive inductor circuit 330c, then only the bump 320a may come into direct physical contact with the package 360.

Although such customized passive circuit structures as described in FIG. 3 create less issues for wire-bonding, the passive circuit structures may impact underfill flow, particularly with respect to flip chip packaging. They also have the advantage, by incorporating organic or inorganic materials, of being built in open regions of a die such as chip 300, to minimize assembly issues.

FIG. 4 illustrates perspective views of a portion of a substrate that includes stubs and an antenna on a BEOL C4 connection layer, in accordance with various embodiments. BEOL 404a, which may be similar to BEOL 104 of FIG. 1, shows a perspective view of a patch antenna with a ground ring 430a, which may be similar to passive circuit 130 of FIG. 1. In embodiments, other bumps 420a, which may be similar to C4 bumps 120 of FIG. 1, may also be placed proximate to the patch antenna with a ground ring 430a. In embodiments, the ground ring 430a1 may be electrically coupled with a ground within a deeper layer of the BEOL 404a, and the antenna 430a2 may also be electrically coupled with BEOL 404a. In embodiments, the patch antenna with a ground ring 430a may be formed using existing techniques for forming bumps on a C4 connection layer.

BEOL 404b, which may be similar to BEOL 104 of FIG. 1, shows a perspective view of stubs such as open stub 430b1, shortened stub 430b2, and radial stub 430b3. These may be similar to passive circuit 130 of FIG. 1. In embodiments, other bumps 420b, which may be similar to C4 bumps 120 of FIG. 1, may also be placed proximate to the stubs 430b1, 430b2, 430b3. In embodiments, open stub 430b1, shortened stub 430b2, and radial stub 430b3 may be formed using existing techniques for forming bumps on a C4 connection layer.

FIG. 5 illustrates a perspective view and a cross section side view of a coplanar waveguide on a BEOL C4 connection layer, in accordance with various embodiments. Partial BEOL 504, which may be similar to BEOL 104 of FIG. 1, shows a coplanar waveguide 530, which may be similar to passive circuit 130 of FIG. 1. In embodiments, the coplanar waveguide 530 may include a first ground line 562 and a second ground line 564 that are on either side of a signal line 566. In embodiments, the coplanar waveguide 530 may be within the C4 connection layer 510, which may be similar to C4 connection layer 110 of FIG. 1.

In embodiments, the first ground line 562 and the second ground line 564 may be coupled with a ground plane 568, which may be in metal layer 504c, which may be similar to metal layer 104c of FIG. 1. In embodiments, the ground plane 568 may extend below the signal line 566 and be at least partially between the first ground line 562 and the second ground line 564.

In embodiments, the ground plane 568 may be electrically coupled with electrical routings 570 within the metal layer 504c, and may electrically couple with the first ground line 562 and the second ground line 564 using electrical routings 572 within metal layer 504e and using electrical routings 574 within metal layer 504g. Metal layer 504e may be similar to metal layer 104e and metal layer 504g may be similar to metal layer 104g of FIG. 1. In embodiments, the metal layer 504g may correspond to a GMB layer which may have a thickness on the order of 3 μm, the metal layer 504e may correspond to a GMO layer, which may have a thickness on the order of 2 μm, and metal layer 504c may correspond to a GMZ layer. Diagram 505 shows a perspective view of BEOL 504.

FIG. 6 illustrates a perspective view and a cross section side view of a combiner circuit with a microstrip on a BEOL C4 connection layer, in accordance with various embodiments. Partial BEOL 604, which may be similar to BEOL 104 of FIG. 1, shows a cross section side view that includes a microstrip 666 and a plurality of bumps 620 that are on a C4 connection layer 610, which may be similar to C4 connection layer 110 of FIG. 1. The microstrip 666 is electrically coupled with traces input 1 672, input 2 674, input 3 676, and input 4 678, in a combiner formation 679. Partial BEOL 605 shows a perspective view of partial BEOL 604. In embodiments, input 1 672, input 2 674, input 3 676, and input 4 678, may be transmission lines that are built on a GMB layer. Electrical coupling 671 may electrically couple the combiner formation 679 with the microstrip 666.

FIG. 7 illustrates perspective views of examples of packages that include passive circuits on a BEOL C4 connection layer, in accordance with various embodiments. Diagram 701 shows a perspective view of a package 700, which may be similar to package 100 of FIG. 1 that includes bumps 720 and a transmission line 730 that may be similar to C4 bumps 120 and passive circuit 130 of FIG. 1. In embodiments, the package 700 may be referred to as a base die.

In embodiments, a first die 752 and a second die 754 may be physically and/or electrically coupled with the package 700 using bumps 720. In embodiments, the first die 752 and the second die 754 may be referred to as top dies. In embodiments, the transmission line 730, which may be a high-speed transmission line, may electrically couple the first die 752 with the second die 754. In embodiments, a mold 756 may at least partially surround the first die 752, second die 754, and package 700. In embodiments, the mold 756 may be an organic or an inorganic material. Note that the mold 756 may completely surround the transmission line 730.

Diagram 703, which may be similar to diagram 701, shows a perspective view of the package 700 that includes bumps 720 and an inductor 731, which may be similar to passive circuit 130 of FIG. 1. In embodiments, a first die 752 and a second die 754 may be physically and/or electrically coupled with the package 700 using bumps 720. In embodiments, the inductor 731 may be electrically coupled with the package 700. In embodiments, the mold 756 may at least partially surround the first die 752, second die 754, and package 700. In embodiments, the mold 756 may completely surround the inductor 731.

Figure 8:
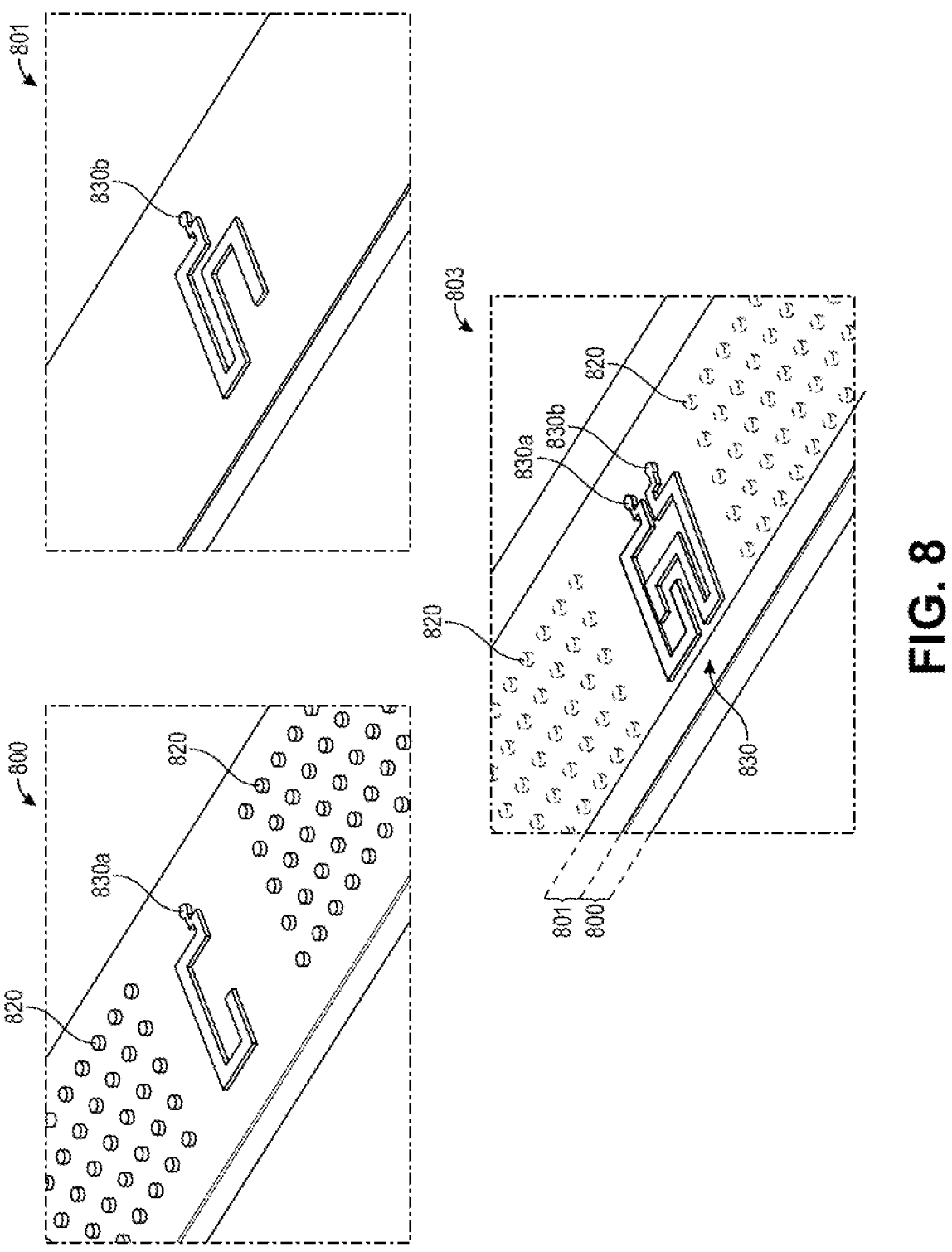
FIG. 8 illustrates perspective views of a BEOL C4 connection layer that includes a partial passive circuit, and another substrate with a partial passive circuit, where the BEOL C4 connection layer and the substrate are coupled to form a passive circuit, in accordance with various embodiments.

FIG. 8 illustrates perspective views of a BEOL C4 connection layer that includes a partial passive circuit, and another substrate with a partial passive circuit, where the BEOL C4 connection layer and the substrate are coupled to form a passive circuit, in accordance with various embodiments. Partial BEOL 800, which may be similar to BEOL 100 of FIG. 1, includes bumps 820 and part of an inductor 830a, which may be similar, respectively, to C4 bumps 120 and passive circuit 130 of FIG. 1. Substrate 801 includes another part of an inductor 830b, which may be related to inductor 830a. Resulting package 803 is formed by physically coupling the surface of substrate 801 with the BEOL 800, such that the part of the inductor 830a and the part of the inductor 830b form a complete inductor 830. Although inductor 830 is shown, a similar technique may be used to create any passive circuit, for example passive circuit 130 of FIG. 1.

Figure 9A:
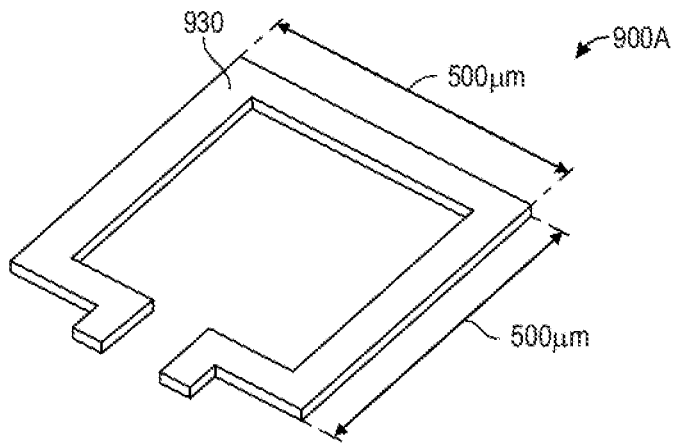
FIGS. 9A-9C illustrates performance test results of legacy passive circuits in a substrate versus passive circuits on a BEOL C4 connection layer, in accordance with various embodiments.
Figure 9A:
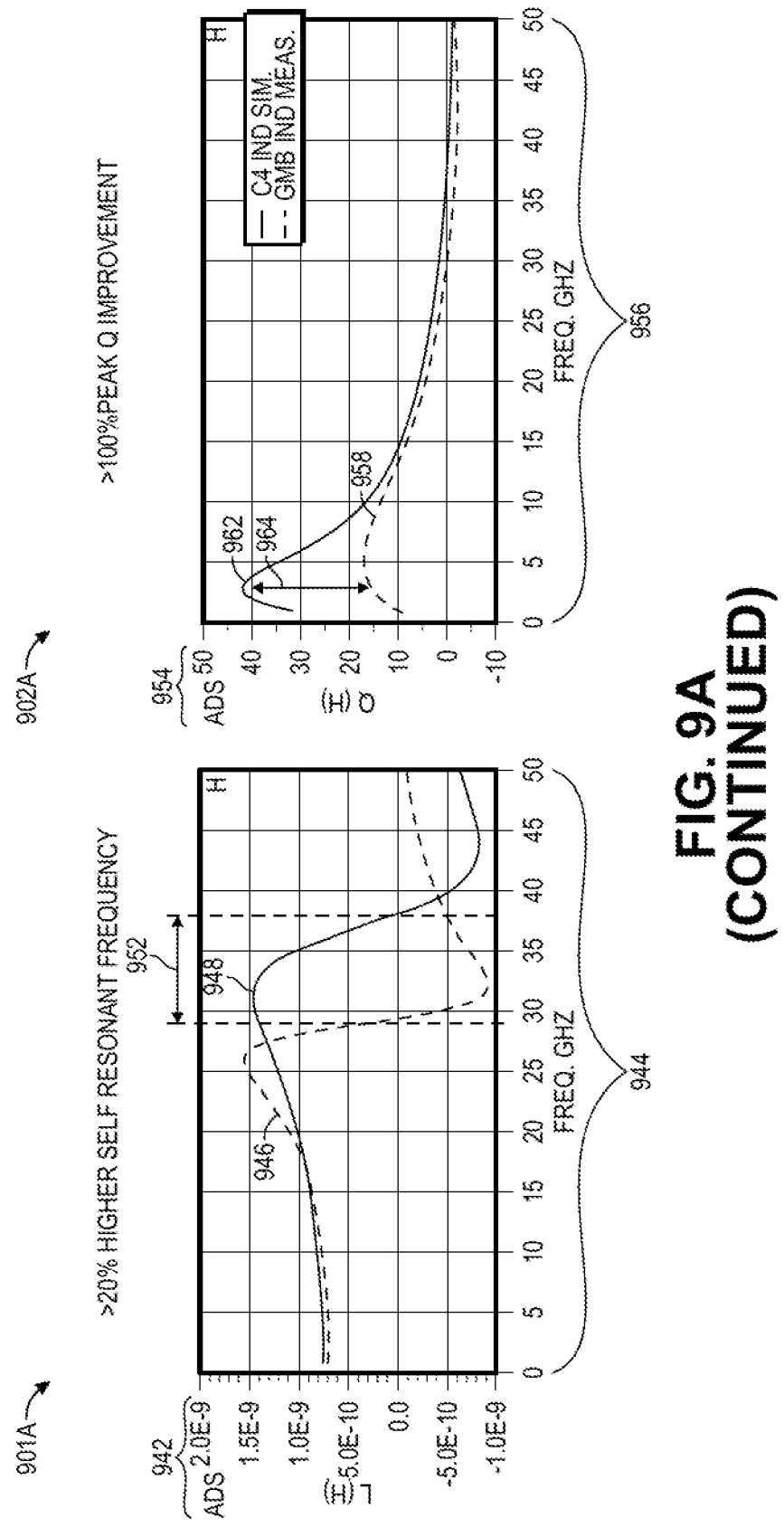
Figure 9B:
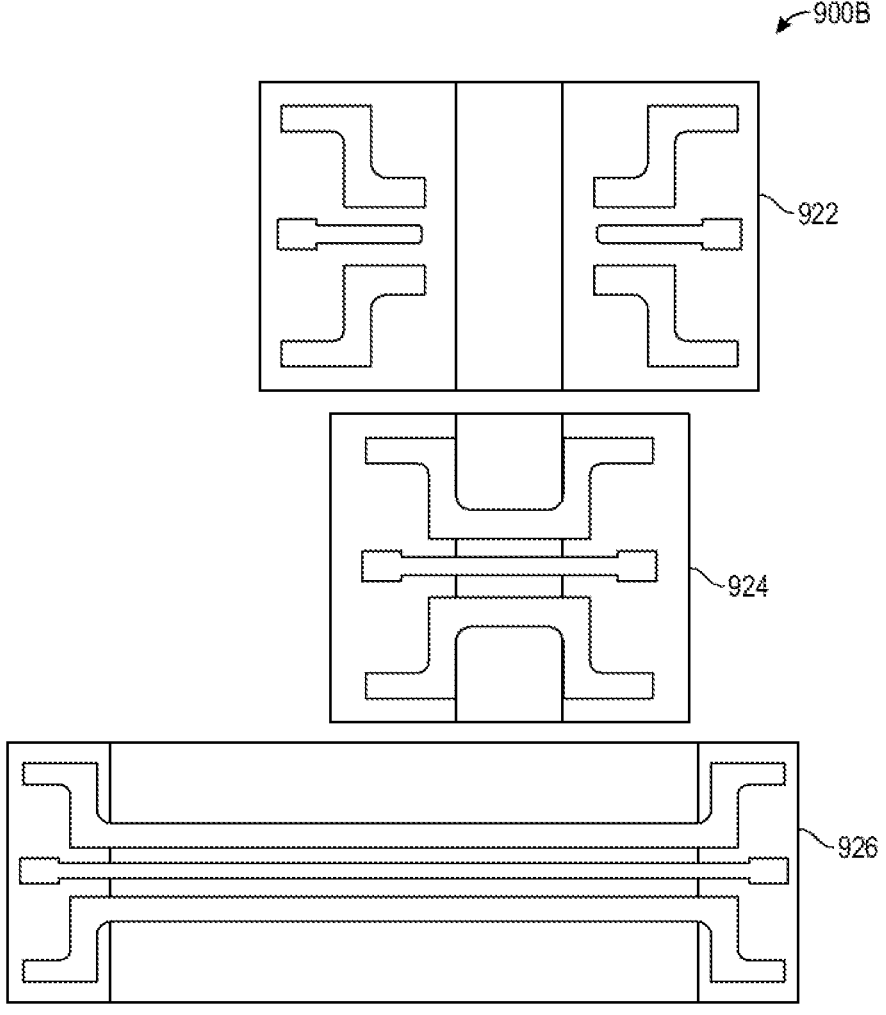
Figure 9B:
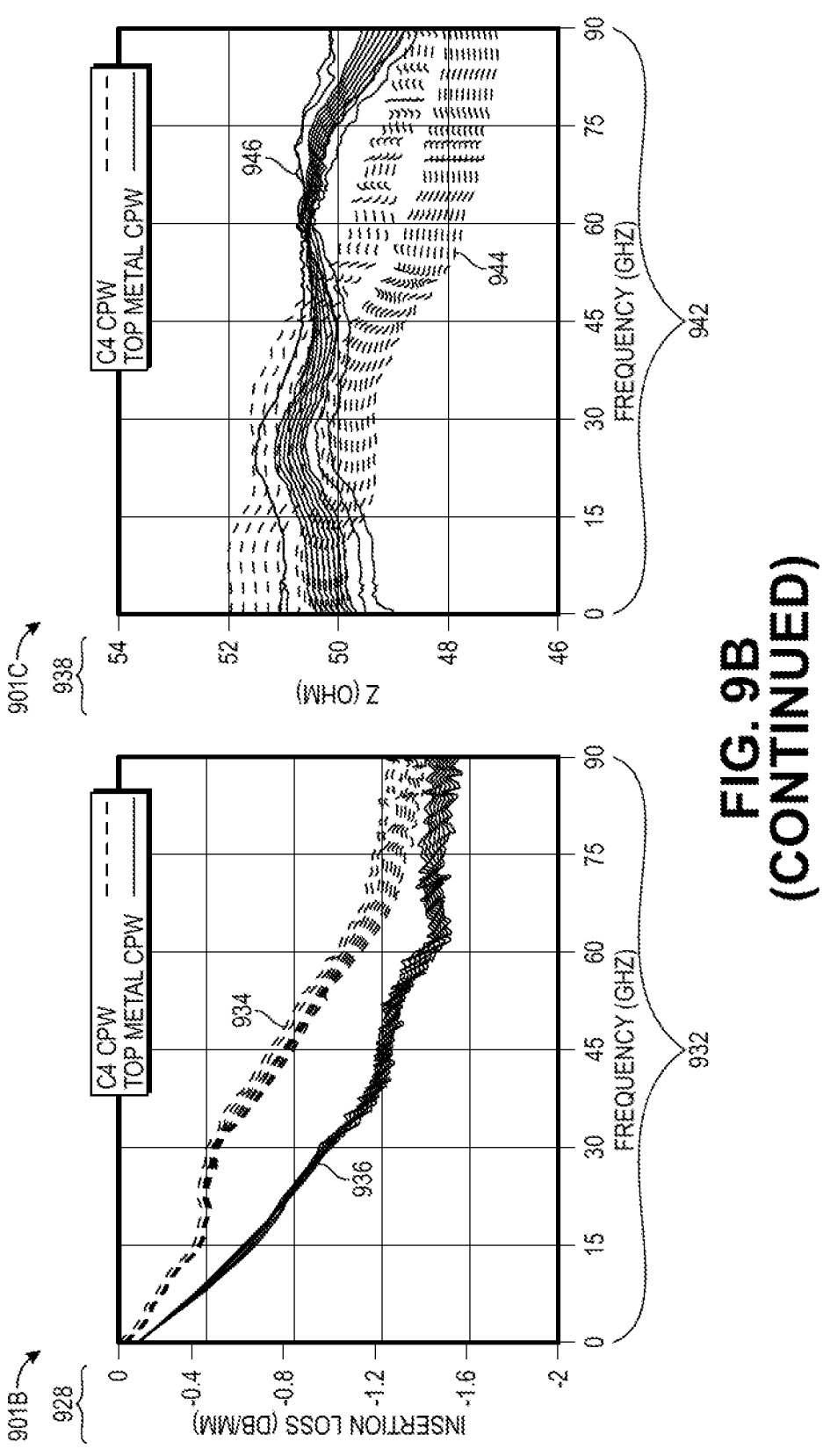
Figure 9C:
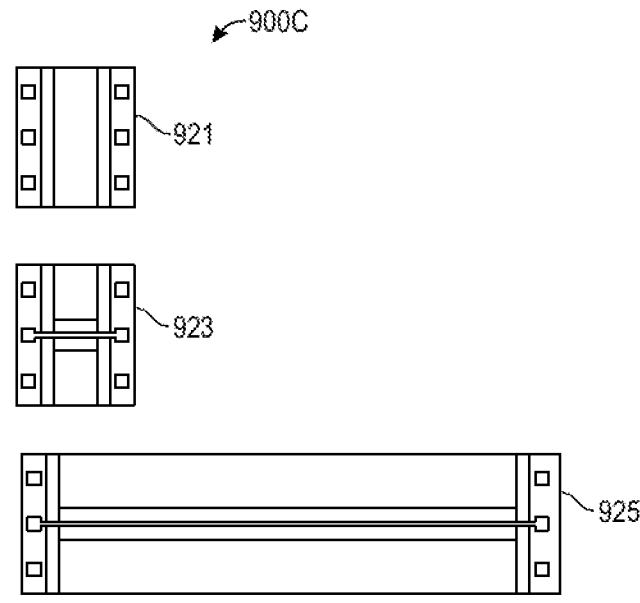
Figure 9C:
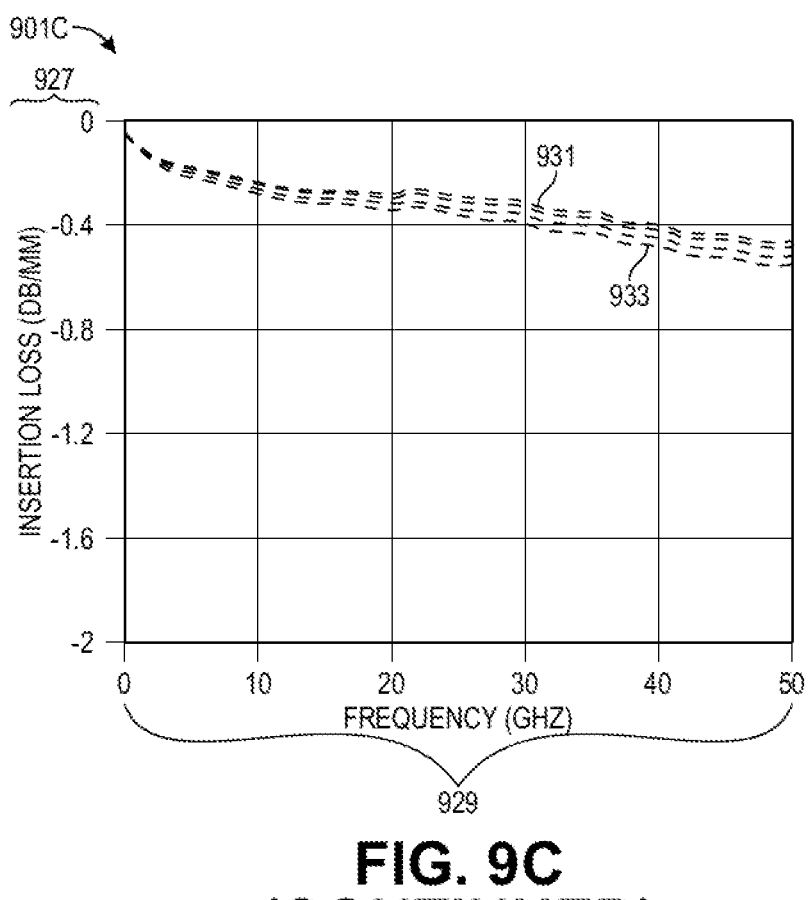

FIGS. 9A-9C illustrates performance test results of legacy passive circuits in a substrate versus passive circuits on a BEOL C4 connection layer, in accordance with various embodiments. FIG. 9A illustrates performance test results of a legacy inductor in a substrate versus an inductor in a BEOL C4 connection layer. Diagram 900A shows a perspective view of an inductor 930 that may be constructed within a substrate in a legacy implementation, or may be constructed on BEOL C4 connection layer such as BEOL C4 connection layer 110 of FIG. 1. The inductor 930 has a size of 500 μm×500 μm. Legacy implementations to test against embodiments may have parameters as shown in diagram 903A.

FIG. 9A (continued) diagram 901A shows a graph that measures inductance in Henrys 942 against frequency in GHz 944 for the legacy implementation within a substrate shown as line 946, and within a BEOL C4 connection layer as shown in line 948. Range 952 shows a difference in the self-resonant frequency between legacy and embodiments, and shows a 20% higher self-resonant frequency for embodiments in the BEOL C4 connection layer. Diagram 902A shows a graph that measures Q performance 954 against frequency GHz 956 for the legacy implementation within a substrate shown as line 958, and within a BEOL C4 connection layer as shown in line 962. Range 964 shows a greater than 100% peak Q improvement. Both diagrams 901A and 902A show repeatability, with inductance variations within +/−0.02 nH, and Q variations within +/−2.0.

Table 903A shows dimensions and results of various parameters of inductors, where the parameters include a size 966, space 968, width 970, number of turns 972, inductance 974, Qmax value 976 and self-resonant frequency (SRF) 978.

FIG. 9B illustrates performance test results of a legacy coplanar waveguide in a substrate versus a coplanar waveguide in a BEOL C4 connection layer. Diagram 900B shows examples of various forms of coplanar waveguides, including open coplanar waveguides 922, thru coplanar waveguides 924, which may be at 150 μm dimension, and a line coplanar waveguide 926 which may have a 750 μm dimension. Note that, in embodiments, the various coplanar waveguides may be tunable slow-wave coplanar waveguides where a phase shift may be controlled by turning on or off a switch (not shown) to alter a connection to a bottom shield (not shown).

FIG. 9B (continued) diagram 901B shows a graph that compares insertion loss 928 measured in dB/mm, compared to frequency measured in GHz 932. For example, a fabricated TRL set and de-embedded C4 coplanar waveguide measurement may result in up to 90 GHz and in comparison with a coplanar waveguide built within metal layers of Intel 16 mmWave BEOL. The C4 coplanar waveguide line shows clear improvements in insertion loss up to 60 GHz, where the characteristic impedance is within 50±20 hm. In addition, approximately 0.8 dB/mm insertion loss at 50 GHz is achieved, which is −0.5 dB lower compared to a CPW built using BEOL metal layers. Note that the line 936 showing the results of legacy coplanar waveguide implementations shows a greater insertion loss than the line 934 of embodiments of coplanar waveguides within a BEOL C4 connection layer.

FIG. 9B (continued) diagram 902B shows a graph that compares Z values 938 in Ohms vs frequency measure in GHz 942. Note that the group of lines 946 of the legacy coplanar waveguide implementations is different from the group of lines 944 of embodiments of coplanar waveguides within a BEOL C4 connection layer.

FIG. 9C illustrates performance test results of a legacy microstrip transmission line in a substrate versus a microstrip transmission line in a BEOL C4 connection layer. Diagram 900C shows examples of various forms of microstrip transmission lines, including open microstrip transmission lines 921, thru microstrip transmission lines 923, and microstrip transmission line 925 that have a dimension of 1150 μm.

FIG. 9C (continued) diagram 901C shows a graph that compares insertion loss 927, measured in dB/mm, with frequency measured in GHz 929. Micro-strip tends to have lower insertion loss compared to a coplanar waveguide at lower frequencies until radiation loss increases significantly. A fabricated TRL set and de-embedded insertion loss of uniformly distributed 21 DUTs on two wafers was used. Measurement results show that the insertion loss of C4 micro-strip line is approximately 0.5 dB/mm at 50 GHz, which is 0.3 dB lower compared to C4 coplanar waveguide.

The group of lines 931 that represent embodiments in microstrip transmission line in a BEOL C4 connection layer show a lower insertion loss than the group of lines 933 of legacy microstrip transmission lines. In embodiments, all traces may be microstrip transmission lines within a C4 layer. Diagram 902C shows dimensions and results of various parameters for tested coplanar waveguides of FIG. 9B and microstrip transmission lines of FIG. 9C. The parameters include signal width 935 measured in μm, space 937 measured in μm, ground width 941 measured in μm, Z0 943 measured in ohms, and insertion loss 945 measured in dB/mm.

FIG. 10 illustrates an example of a process for creating a passive circuit on a BEOL of a package, in accordance with various embodiments. Process 1000 may be implemented using systems, processes, techniques, or apparatuses described herein, and in particular with respect to FIGS. 1-9C.

At block 1002, the process may include providing a package that includes a substrate and a BEOL coupled with the substrate. In embodiments, the package may be similar to package 100 of FIG. 1. In embodiments, the substrate may be similar to FEOL 102 and in embodiments the BEOL may be similar to BEOL 104 of FIG. 1.

At block 1004, the process may further include applying a plurality of bumps to a side of the BEOL wherein the applied plurality of bumps have a height that is at least a first height from a surface of the side of the substrate. In embodiments, the plurality of bumps may be similar to C4 bumps 120 of FIG. 1. In embodiments, the bumps may include copper pillars.

At block 1006, the process may further include a passive circuit to the side of the BEOL, wherein a height of the passive circuit from the surface of the side of the substrate is at or below a second height, and wherein the first height is greater than the second height. In embodiments, the passive circuit may be similar to partial passive circuit 130 of FIG. 1.

Figure 11:
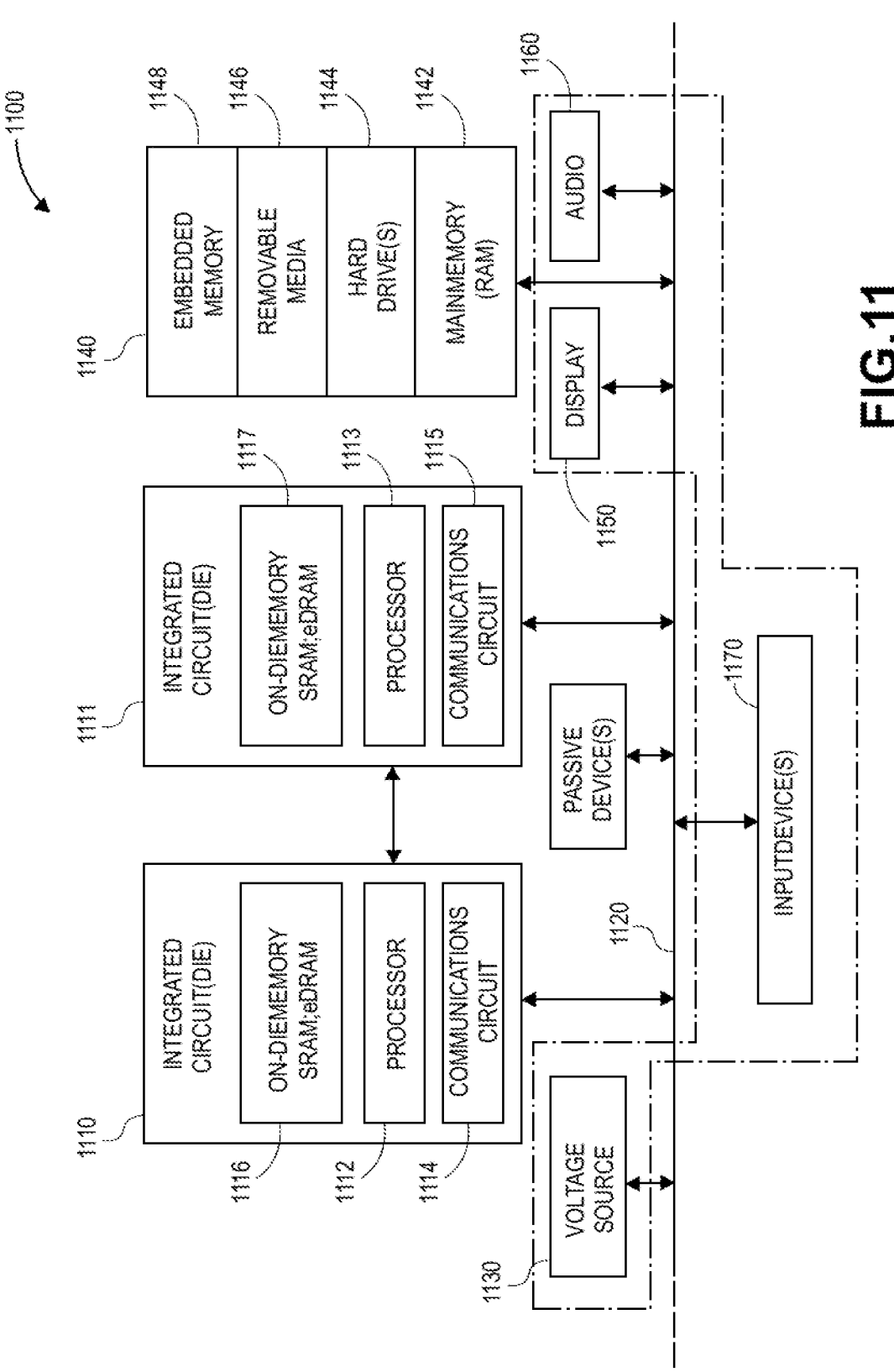
FIG. 11 schematically illustrates a computing device, in accordance with various embodiments.

FIG. 11 is a schematic of a computer system 1100, in accordance with an embodiment of the present invention. The computer system 1100 (also referred to as the electronic system 1100) as depicted can embody a passive circuit on a BEOL, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, a passive circuit on a BEOL, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including a package substrate having a passive circuit on a BEOL, according to any of the several disclosed embodiments and their equivalents, an electronic system, a computer system, one or more methods of fabricating an integrated circuit, and one or more methods of fabricating an electronic assembly that includes a package substrate having a passive circuit on a BEOL, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a passive circuit on a BEOL embodiments and their equivalents. A foundation substrate may be included, as represented by the dashed line of FIG. 11. Passive devices may also be included, as is also depicted in FIG. 11.

EXAMPLES

The following paragraphs describe examples of various embodiments.

Example 1 is a package comprising: a substrate; a back-end-of-line (BEOL) on the substrate; a plurality of bumps on a side of the BEOL, wherein the plurality of bumps have a height that is at least a first height from the surface of the side of the BEOL; a passive circuit on the side of the BEOL, wherein a height of the electrically conductive feature from the surface of the side of the BEOL is at or below a second height; and wherein the first height is greater than the second height.

Example 2 includes the package of example 1, or of any other example or embodiment described herein, wherein the passive circuit includes at least a portion of a selected one more of: an inductor, a microstrip, a coplanar waveguide, a transmission line, an antenna, or a combiner.

Example 3 includes the package of example 1, or of any other example or embodiment described herein, wherein the passive circuit includes copper.

Example 4 includes the package of example 1, or of any other example or embodiment described herein, wherein the passive circuit is electrically coupled with a metal layer at or below the side of the substrate.

Example 5 includes the package of example 1, or of any other example or embodiment described herein, wherein the passive circuit has a width between 15 μm and 55 μm and a height less than 18 μm.

Example 6 includes the package of example 1, or of any other example or embodiment described herein, wherein the passive circuit is electrically coupled with one of the plurality of bumps on the side of the BEOL.

Example 7 includes the package of example 6, or of any other example or embodiment described herein, wherein one of the plurality of bumps on the side of the BEOL is a first one of the plurality of bumps on the side of the BEOL; and further comprising a second one of the plurality of bumps on the side of the BEOL, wherein the passive circuit is electrically coupled with the second one of the plurality of bumps on the side of the BEOL.

Example 8 is a system comprising: a package that includes a first substrate with a BEOL on the first substrate, wherein a side of the BEOL includes a plurality of bumps, and wherein the plurality of bumps is at least a first height from a surface of the side of the BEOL; a passive circuit on the side of the BEOL, wherein a height of the passive circuit from the surface of the side of the BEOL is at or below a second height, and wherein the first height is greater than the second height; and a second substrate, wherein a side of the second substrate is coupled with the side of the BEOL using at least a portion of the plurality of bumps on the side of the BEOL.

Example 9 includes the system of example 8, or of any other example or embodiment described herein, wherein at least a portion of the passive circuit is between the BEOL of the first substrate and the second substrate.

Example 10 includes the system of example 8, or of any other example or embodiment described herein, wherein the passive circuit on the side of the BEOL is not directly electrically coupled with the second substrate.

Example 11 includes the system of example 8, or of any other example or embodiment described herein, wherein the passive circuit is electrically coupled with at least one of the plurality of bumps on the side of the BEOL.

Example 12 includes the system of example 8, or of any other example or embodiment described herein, wherein the passive circuit is a first passive circuit; and further comprising a second passive circuit on the side of the second substrate.

Example 13 includes the system of example 12, or of any other example or embodiment described herein, wherein the second passive circuit on the side of the second substrate at least partially overlaps with the first passive circuit on the side of the BEOL.

Example 14 includes the system of example 13, or of any other example or embodiment described herein, wherein the first passive circuit and the second passive circuit are electrically coupled with each other.

Example 15 includes a system of example 8, or of any other example or embodiment described herein, further comprising a mold at least partially surrounding the package, the second substrate, and the passive circuit.

Example 16 includes the system of example 8, or of any other example or embodiment described herein, wherein at least a portion of the passive circuit includes at least a portion of a selected one more of: an inductor, a microstrip, a coplanar waveguide, a transmission line, an antenna, or a combiner.

Example 17 includes the system of example 8, or of any other example or embodiment described herein, further comprising a third substrate, wherein a side of the third substrate is coupled with the side of the BEOL using at least a portion of the plurality of bumps on the side of the BEOL.

Example 18 includes the system of example 17, or of any other example or embodiment described herein, wherein the passive circuit is at least partially between the second substrate and the third substrate with respect to the side of the BEOL.

Example 19 includes the system of example 17, or of any other example or embodiment described herein, wherein the passive circuit is electrically coupled with the BEOL, and wherein the passive circuit is electrically coupled with the second substrate or with the third substrate.

Example 20 includes the system of example 8, or of any other example or embodiment described herein, wherein the passive circuit is electrically coupled with a metal layer of the BEOL.

Example 21 includes the system of example 8, or of any other example or embodiment described herein, wherein the package and the second substrate are in a flip chip formation.

Example 22 includes the system of example 8, or of any other example or embodiment described herein, wherein the passive circuit includes copper.

Example 23 is a method comprising: providing a package that includes a substrate and a BEOL coupled with the substrate; applying a plurality of bumps to a side of the BEOL wherein the applied plurality of bumps have a height that is at least a first height from a surface of the side of the substrate; and applying a passive circuit to the side of the BEOL, wherein a height of the passive circuit from the surface of the side of the substrate is at or below a second height, and wherein the first height is greater than the second height.

Example 24 includes the method of example 23, or of any other example or embodiment described herein, wherein the substrate is a first substrate; and further comprising: providing a second substrate; and coupling a side of the second substrate to the side of the BEOL, wherein coupling the side of the second substrate includes coupling the side of the second substrate to at least a portion of the plurality of bumps on the side of the BEOL.

Example 25 includes the method of example 23, or of any other example or embodiment described herein, wherein the passive circuit includes copper, and wherein the passive circuit includes at least a portion of a selected one or more of: an inductor, a microstrip, a coplanar waveguide, a transmission line, an antenna, or a combiner.

Example 26 is a package comprising: a substrate; a dielectric layer on the substrate; a metal layer on the dielectric layer; a plurality of conductive interconnect features on or over the metal layer, wherein the plurality of conductive interconnect features have a height that is at least a first height from a surface of the metal layer; a electrically conductive feature on or over the metal layer, wherein a height of the electrically conductive feature from the surface of the metal layer is at or below a second height; and wherein the first height is greater than the second height.

Example 27 includes the package of example 26, or of any other example or embodiment herein, wherein the electrically conductive feature includes at least a portion of a selected one more of: an inductor, a microstrip, a coplanar waveguide, a transmission line, an antenna, or a combiner.

Example 28 includes the package of example 26, or of any other example or embodiment herein, wherein the electrically conductive feature includes copper.

Example 29 includes the package of example 26, or of any other example or embodiment herein, wherein the electrically conductive feature is electrically coupled with the metal layer.

Example 30 includes the package of example 26, or of any other example or embodiment herein, wherein the electrically conductive feature has a width between 15 µm and 55 µm and a height less than 18 µm.

Example 31 includes the package of example 26, or of any other example or embodiment herein, wherein the electrically conductive feature is electrically coupled with one of the plurality of conductive interconnect features.

Example 32 includes the package of example 26, or of any other example or embodiment herein, wherein the plurality of conductive interconnect features comprise copper pillars.

Example 33 includes the package of example 26, or of any other example or embodiment herein, further comprising an electrically conductive via between the metal layer and the substrate, the via electrically coupling the metal layer to the substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
a substrate;
a dielectric layer on the substrate;
a metal layer on the dielectric layer;
a plurality of conductive interconnect features on or over the metal layer, wherein the plurality of conductive interconnect features have a height that is at least a first height from a surface of the metal layer;
an electrically conductive feature on or over the metal layer, wherein a height of the electrically conductive feature from the surface of the metal layer is at or below a second height, the electrically conductive feature directly electrically coupled to one of the plurality of conductive interconnect features; and
wherein the first height is greater than the second height.

2. The package of claim 1, wherein the electrically conductive feature includes at least a portion of a selected one more of: an inductor, a microstrip, a coplanar waveguide, a transmission line, an antenna, or a combiner.

3. The package of claim 1, wherein the electrically conductive feature includes copper.

4. The package of claim 1, wherein the electrically conductive feature is electrically coupled with the metal layer.

5. The package of claim 1, wherein the electrically conductive feature has a width between 15 µm and 55 µm and a height less than 18 µm.

6. The package of claim 1, wherein the electrically conductive feature is electrically coupled with one of the plurality of conductive interconnect features.

7. The package of claim 1, wherein the plurality of conductive interconnect features comprise copper pillars.

8. The package of claim 1, further comprising an electrically conductive via between the metal layer and the substrate, the via electrically coupling the metal layer to the substrate.

9. A system comprising:
a package that includes a first substrate with a BEOL on the first substrate, wherein a side of the BEOL includes a plurality of bumps, and wherein the plurality of bumps is at least a first height from a surface of the side of the BEOL;
a passive circuit on the side of the BEOL, wherein a height of the passive circuit from the surface of the side of the BEOL is at or below a second height, and wherein the first height is greater than the second height, the passive circuit directly electrically coupled to one of the plurality of bumps; and a second substrate, wherein a side of the second substrate is coupled with the side of the BEOL using at least a portion of the plurality of bumps on the side of the BEOL.

10. The system of claim 9, wherein at least a portion of the passive circuit is between the BEOL of the first substrate and the second substrate.

11. The system of claim 9, wherein the passive circuit on the side of the BEOL is not directly electrically coupled with the second substrate.

12. The system of claim 9, wherein the passive circuit is electrically coupled with at least one of the plurality of bumps on the side of the BEOL.

13. The system of claim 9, wherein the passive circuit is a first passive circuit; and further comprising a second passive circuit on the side of the second substrate.

14. The system of claim 13, wherein the second passive circuit on the side of the second substrate at least partially overlaps with the first passive circuit on the side of the BEOL.

15. The system of claim 14, wherein the first passive circuit and the second passive circuit are electrically coupled with each other.

16. The system of claim 9, further comprising a mold at least partially surrounding the package, the second substrate, and the passive circuit.

17. The system of claim 9, wherein at least a portion of the passive circuit includes at least a portion of a selected one more of: an inductor, a microstrip, a coplanar waveguide, a transmission line, an antenna, or a combiner.

18. The system of claim 9, further comprising a third substrate, wherein a side of the third substrate is coupled with the side of the BEOL using at least a portion of the plurality of bumps on the side of the BEOL.

19. The system of claim 18, wherein the passive circuit is at least partially between the second substrate and the third substrate with respect to the side of the BEOL.

20. The system of claim 18, wherein the passive circuit is electrically coupled with the BEOL, and wherein the passive circuit is electrically coupled with the second substrate or with the third substrate.

21. The system of claim 9, wherein the passive circuit is electrically coupled with a metal layer of the BEOL.

22. The system of claim 9, wherein the package and the second substrate are in a flip chip formation.

23. A method comprising:
providing a package that includes a substrate and a BEOL coupled with the substrate;
applying a plurality of bumps to a side of the BEOL wherein the applied plurality of bumps have a height that is at least a first height from a surface of the side of the substrate; and
applying a passive circuit to the side of the BEOL, wherein a height of the passive circuit from the surface of the side of the substrate is at or below a second height, and wherein the first height is greater than the second height, the passive circuit directly electrically coupled to one of the plurality of bumps.

24. The method of claim 23, wherein the substrate is a first substrate; and further comprising:
providing a second substrate; and
coupling a side of the second substrate to the side of the BEOL, wherein coupling the side of the second substrate includes coupling the side of the second substrate to at least a portion of the plurality of bumps on the side of the BEOL.

25. The method of claim 23, wherein the passive circuit includes copper, and wherein the passive circuit includes at least a portion of a selected one or more of: an inductor, a microstrip, a coplanar waveguide, a transmission line, an antenna, or a combiner.

26. A system comprising:
a package that includes a first substrate with a BEOL on the first substrate, wherein a side of the BEOL includes a plurality of bumps, and wherein the plurality of bumps is at least a first height from a surface of the side of the BEOL;
a passive circuit on the side of the BEOL, wherein a height of the passive circuit from the surface of the side of the BEOL is at or below a second height, and wherein the first height is greater than the second height; and
a second substrate, wherein a side of the second substrate is coupled with the side of the BEOL using at least a portion of the plurality of bumps on the side of the BEOL, wherein the passive circuit is a first passive circuit; and further comprising a second passive circuit on the side of the second substrate.

27. The system of claim 26, wherein the second passive circuit on the side of the second substrate at least partially overlaps with the first passive circuit on the side of the BEOL.

28. The system of claim 26, wherein the first passive circuit and the second passive circuit are electrically coupled with each other.

29. A system comprising:
a package that includes a first substrate with a BEOL on the first substrate, wherein a side of the BEOL includes a plurality of bumps, and wherein the plurality of bumps is at least a first height from a surface of the side of the BEOL;
a passive circuit on the side of the BEOL, wherein a height of the passive circuit from the surface of the side of the BEOL is at or below a second height, and wherein the first height is greater than the second height;
a second substrate, wherein a side of the second substrate is coupled with the side of the BEOL using at least a portion of the plurality of bumps on the side of the BEOL; and
a mold at least partially surrounding the package, the second substrate, and the passive circuit.

30. A system comprising:
a package that includes a first substrate with a BEOL on the first substrate, wherein a side of the BEOL includes a plurality of bumps, and wherein the plurality of bumps is at least a first height from a surface of the side of the BEOL;
a passive circuit on the side of the BEOL, wherein a height of the passive circuit from the surface of the side of the BEOL is at or below a second height, and wherein the first height is greater than the second height;
a second substrate, wherein a side of the second substrate is coupled with the side of the BEOL using at least a portion of the plurality of bumps on the side of the BEOL; and
a third substrate, wherein a side of the third substrate is coupled with the side of the BEOL using at least a portion of the plurality of bumps on the side of the BEOL, wherein the passive circuit is at least partially between the second substrate and the third substrate with respect to the side of the BEOL.

\* \* \* \* \*